(12) United States Patent
Leuciuc

(10) Patent No.: US 9,000,962 B1
(45) Date of Patent: Apr. 7, 2015

(54) SYSTEM AND METHOD FOR INTERLEAVED ANALOG-TO-DIGITAL CONVERSION HAVING SCALABLE SELF-CALIBRATION OF TIMING

(71) Applicant: Cadence Design Systems, Inc., San Jose, CA (US)

(72) Inventor: Adrian Luigi Leuciuc, Frederick, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/166,407

(22) Filed: Jan. 28, 2014

(51) Int. Cl.
*H03M 1/08* (2006.01)
*H03M 1/12* (2006.01)
*H03M 1/10* (2006.01)

(52) U.S. Cl.
CPC ............ *H03M 1/1023* (2013.01); *H03M 1/121* (2013.01); *H03M 1/0836* (2013.01)

(58) Field of Classification Search
CPC . H03M 1/0656; H03M 1/0836; H03M 1/121; H03M 1/1215
See application file for complete search history.

(56) References Cited

U.S. PATENT DOCUMENTS

| | | | |
|---|---|---|---|
| 7,808,408 B2 * | 10/2010 | Madisetti et al. | 341/118 |
| 2011/0006933 A1 * | 1/2011 | Nagarajan et al. | 341/118 |
| 2012/0262318 A1 * | 10/2012 | Straayer et al. | 341/120 |
| 2013/0241755 A1 * | 9/2013 | Chen et al. | 341/120 |

OTHER PUBLICATIONS

Haftbaradaran et al., A Background Sample-Time Error Calibration Technique Using Random Data for Wide-Band High-Resolution Time-Interleaved ADCs, IEEE Transactions on Circuits and Systems—II: Express Briefs, vol. 55, No. 3, Mar. 2008.*
Roberts, Engineering Computation Lecture 6 Estimating Derivatives and Integrals, circa Nov. 2006, Internet URL: http://www.robots.ox.ac.uk/~sjrob/Teaching/EngComp/ecl6.pdf.*
Razavi, Behzad. "Design Considerations for Interleaved ADCs." IEEE Journal of Solid-State Circuits 48, No. 8 (2013).
Stepanovic, Dusan, and Borivoje Nikolic. "A 2.8 GS/s 44.6 mW Time-Interleaved ADC Achieving 50.9 dB SNDR and 3 dB Effective Resolution Bandwidth of 1.5 GHz in 65 nm CMOS." J. Solid-State Circuits 48, No. 4 (2013): 971-982.

(Continued)

*Primary Examiner* — Howard Williams
(74) *Attorney, Agent, or Firm* — Rosenberg, Klein & Lee

(57) ABSTRACT

A system and method are provided for adaptive self-calibration to remove sample timing error in time-interleaved ADC of an analog signal. A plurality of ADC channels recursively sample the analog signal within a series of sample segments according to a predetermined sampling clock to generate a time-interleaved series of output samples. A timing skew detection unit is coupled to the ADC channels, which generates for each sample segment a timing skew factor indicative of sampling clock misalignment within the sample segment. Each timing skew factor is generated based adaptively on the output samples for a selective combination of segments including at least one preceding and at least one succeeding sample segment. A plurality of timing control units respectively coupled to the ADC channels adjust time delays for the sampling clock within respective sample segments responsive to the timing skew factors, thereby substantially aligning the sample segments with the sampling clock.

20 Claims, 14 Drawing Sheets

(56) References Cited

OTHER PUBLICATIONS

El-Chammas, Manar, and Boris Murmann. "A 12-GS/s 81-mW 5-bit time-interleaved flash ADC with background timing skew calibration." Solid-State Circuits, IEEE Journal of 46, No. 4 (2011): 838-847.

El-Chammas, Manar, and Boris Murmann. "General analysis on the impact of phase-skew in time-interleaved ADCs." Circuits and Systems I: Regular Papers, IEEE Transactions on 56, No. 5 (2009): 902-910.

Kurosawa, Naoki, Haruo Kobayashi, Kaoru Maruyama, Hidetake Sugawara, and Kensuke Kobayashi. "Explicit analysis of channel mismatch effects in time-interleaved ADC systems." Circuits and Systems I: Fundamental Theory and Applications, IEEE Transactions on 48, No. 3 (2001): 261-271.

Vogel, Christian. "The impact of combined channel mismatch effects in time-interleaved ADCs." Instrumentation and Measurement, IEEE Transactions on 54, No. 1 (2005): 415-427.

\* cited by examiner

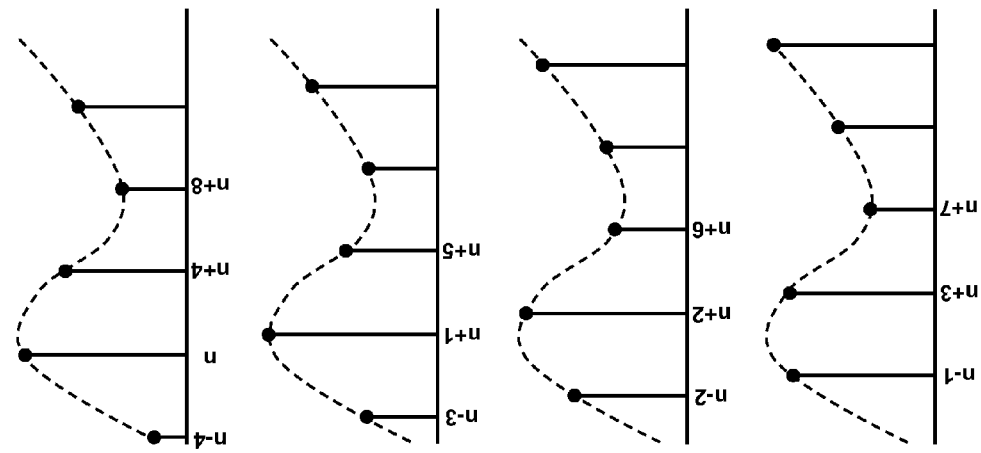
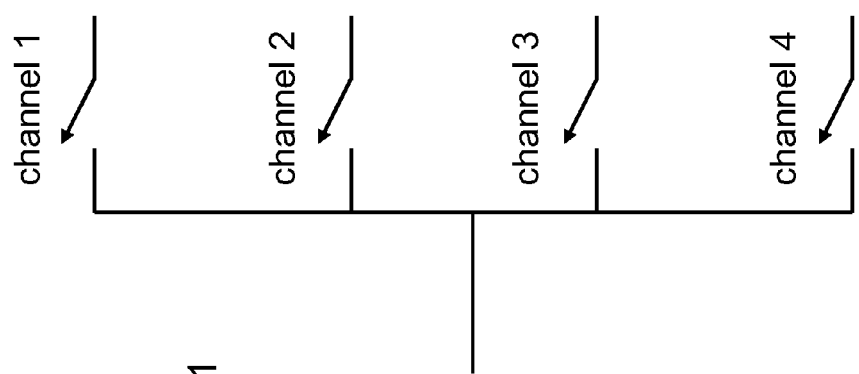
Figure 3b
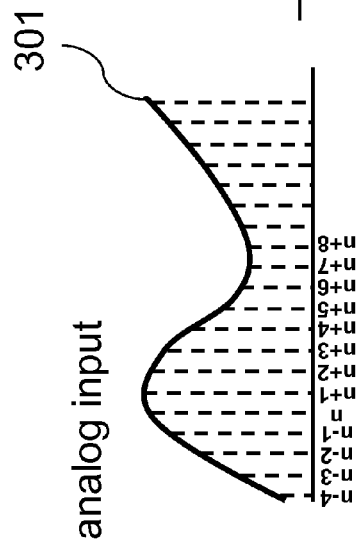
Figure 3a

SYSTEM AND METHOD FOR INTERLEAVED ANALOG-TO-DIGITAL CONVERSION HAVING SCALABLE SELF-CALIBRATION OF TIMING

BACKGROUND OF THE INVENTION

The present invention is generally directed to a system and method for maintaining optimal timing in interleaved analog-to-digital conversion. More specifically, the subject system and method provide for adaptive self-calibration to remove error in the timing of samples taken for the time-interleaved analog-to-digital conversion of a signal. The subject system and method adaptively detect timing skew based on the outputs of a plurality of analog-to-digital converter (ADC) channels, and does so in a computationally optimized manner for scalable application of the self-calibration to increasingly high sampling rate cases requiring increased multiplicity of interleaved channels.

With ongoing advances in device technologies, there is ever increasing demand for greater speed in circuit operations, such as in the conversion of analog signals to digital form. Where the required conversion rate exceeds the capabilities of one ADC, a plurality of parallel interleaved ADCs have been used in the art to effectively achieve the required conversion rate. A plurality of ADC channels are operated in parallel to each convert a segment of a given analog signal. The ADC channels are synchronized to a common sampling clock, but in mutually phase-offset manner within each cycle of ADC operation (or 'sampling cycle'), so that they are timed accordingly to sample and convert their different respective signal segments. The effective sampling rate may be increased by increasing the number of ADC channels participating in this process, to in turn increase the number of sample segments within one sampling cycle.

Such parallel interleaved ADC architectures, however, are prone to errors due to mismatches in the offsets, gains, and sampling aperture timing of individual converter channels. That is, the precise instant in time that each ADC channel actually samples within a particular sample segment of the analog signal may be skewed due to various real world factors when actually implemented and used. This results in non-uniform sample timing within the sample segments served by different ADC channels, meaning that the channel-to-channel samples are not taken at uniform time intervals. Yet, such uniformity is presumed when the analog signal is reconstructed from the individual samples, leading to inaccurate digital conversion due to this sample timing mismatch.

Attempts have been made in the art to eliminate or reduce the effects of these types of errors between channels, by calibrating the offsets and gains of ADCs in interleaved topologies. FIG. 1 illustrates a more or less 'brute force' approach to eliminating sampling clock timing errors in a parallel interleaved ADC system. In this approach, a time interleaving ADC topology is served by a global front-end sample-and-hold amplifier (SHA) 101. The front-end SHA 101 samples the input analog signal at the full speed of the ADC. Each ADC channel has its own sample-and-hold circuit (each with a clock-driven sample switch 102 and hold capacitor 103) that samples the analog signal at its input, and keeps the sample constant during the full conversion time of the channel's ADC 104. Each individual ADC runs at a clock rate equal to the overall conversion rate divided by the number of channels N, and recursively processes one of every N samples made available by the front-end SHA 101. Because the signal made available by the SHA 101 is held constant in value at its output throughout the sample segment time window for each ADC channel, any timing skew in an individual channel's sampling switch clocking does not affect the value that the channel actually samples. Consequently, any timing skew in the individual channels is ineffectual to the accuracy of the entire system.

This may offer a practicable solution for certain applications (for example, those requiring sampling rates of no more than several GHz and resolution of 10-11 bits), but it does not in many others. The SHA 101 in this approach must be operated at the full speed of overall ADC conversion. Where higher sampling rates are required, therefore, either the power consumption of such SHA is prohibitively excessive, or a fast enough SHA 101 is beyond the limits of known nano-electronic fabrication technologies. The sampling clock timing skew problem must be addressed by other measures.

Calibration processes are known in the art toward that end, but these known calibration processes generally suffer from a general lack of consistent accuracy and efficiency. In certain known approaches, for example, one or more channels are utilized for the acquisition of calibration-specific data. In other known approaches, the calibration is specific to a particular parallel channel configuration, and cannot be readily scaled for effective use in other configurations employing different numbers of ADC channels. In still other approaches, the computations prescribed for multi-channel are complex and yield an excessive processing burden.

There is therefore a need for a system and method by which the timing skew problem is suitably remedied by calibration in a time interleaved ADC system. There is a need for such system and method which carries out effective self-calibration without hindering the conversion operation of the given ADC channels, and which is readily scalable to different applications employing a varying multiplicity of ADC channels.

SUMMARY OF THE INVENTION

It is an object of the present invention to provide a system and method for maintaining optimal timing in interleaved analog-to-digital conversion in computationally efficient manner for various numbers of conversion channels.

It is another object of the present invention to provide a system and method which carries out self-calibration to remove sample timing error in a multi-channel ADC system based on the signal outputs generated by the constituent ADC channels during normal conversion operation.

It is yet another object of the present invention to provide a system and method which carries out effective self-calibration to remove sample timing error in a multi-channel ADC system, which is conveniently scalable to different applications employing varying numbers of ADC channels.

These and other objects are attained in a system formed in accordance with the present invention for adaptive self-calibration to remove sample timing error in time-interleaved analog-to-digital conversion (ADC) of an analog signal. The system includes a plurality of ADC channels that recursively sample the analog signal within a series of sample segments according to a predetermined sampling clock to generate a time-interleaved series of output samples. The output samples are combinable for digital reconstruction of the analog signal. A timing skew detection unit is coupled to the ADC channels, which timing skew detection unit generates for each sample segment a timing skew factor indicative of sampling clock misalignment within the sample segment. The timing skew detection unit generates the timing skew factor based adaptively on the output samples for a selective combination of segments. This combination of segments includes at least one preceding sample segment and at least one succeeding sample segment. A plurality of timing control units are respectively coupled to the ADC channels, which timing control units operate to adjust time delays for the sampling clock within respective sample segments. The adjustment is determined responsive to corresponding ones of the timing skew factors generated by the timing skew detection unit. As a result, the series of sample segments is aligned substantially with the sampling clock.

The various objects of the present invention are further attained in a method implemented in accordance with the present invention for adaptive self-calibration to remove sample timing error in time-interleaved analog-to-digital conversion (ADC) of an analog signal. The method comprises establishing a plurality of ADC channels to recursively sample the analog signal within a series of sample segments according to a predetermined sampling clock. The ADC channels are actuated to generate a time-interleaved series of output samples, which are combinable for digital reconstruction of the analog signal. A timing skew detection is executed to generate for each sample segment a timing skew factor indicative of sampling clock misalignment within the sample segment. The timing skew detection generates the timing skew factor based adaptively on the output samples for a selective combination of segments, which includes at least one preceding sample segment and at least one succeeding sample segment. Timing control is executed for each of the ADC channels in order to adjust a time delay for the sampling clock within each sample segment responsive to a corresponding one of the timing skew factors generated by timing skew detection. The series of sample segments are thereby aligned substantially with the sampling clock.

The various objects of the present invention are also attained in a system implemented in accordance with the present invention that is scalable to a variable multiplicity of channels for adaptive self-calibration to remove synchronization error in time-interleaved analog-to-digital conversion (ADC) of an analog signal. The system includes a plurality of ADC channels recursively sampling the analog signal within a series of sample segments according to a predetermined sampling clock to generate a time-interleaved series of output samples. The ADC channels are actuated in parallel during a sampling cycle upon a frame of sample segments according to correspondingly phase offset versions of the predetermined sampling clock. The output samples are combinable for digital reconstruction of the analog signal. A timing skew detection unit is coupled to the ADC channels, which generates for each sample segment a timing skew factor indicative of sampling clock misalignment within the sample segment. The timing skew detection unit generates the timing skew factor for the sample segment based adaptively on a rate of change in the analog signal thereat, the timing skew factor being estimated as a difference between the output samples of the immediately preceding and immediately succeeding sample segments. The timing skew detection unit includes an error signal generation portion and a timing skew estimator portion coupled thereto. The error signal generation portion includes a plurality of digital delay, first digital multiplier, first digital adder, and averaging cells which are intercoupled for linearly combining and averaging the output samples received from the ADC channels. A set of error signals $X_k$ are thereby generated for the frame of sample segments, the set of error signals $X_k$ being defined according to:

$$X_k = E[\tilde{y}_k[n] \cdot [\tilde{y}_{k+1}[n] - \tilde{y}_{k-1}[n]]], k = 1, \ldots, N$$

In this equation, k represents a channel index iteratively denoting a particular sample segment within the frame of sample segments, n represents a sampling cycle index, N represents the total number of the ADC channels, $\tilde{y}[n]$ represents a value of the output sample at a particularly denoted sample segment and sampling cycle n, and $E\{\ \}$ indicates an averaging operation over a plurality of sampling cycles. A plurality of timing control units are respectively coupled to the ADC channels, which operate to adjust time delays for the sampling clock within respective sample segments responsive to corresponding ones of the timing skew factors generated by the timing skew detection unit. As a result, the series of sample segments is aligned substantially with the sampling clock.

BRIEF DESCRIPTION OF THE DRAWINGS

FIG. 2b is a timing diagram schematically illustrating timing clock signals driving the input sampling in the individual ADC channels of the ADC topology of FIG. 2a;

FIG. 3a is a graphic plot of an analog input signal example, ideally illustrating the uniform sampling thereof to define a series of sampling segments in the example of a 4-channel ADC system;

FIG. 3b is a schematic diagram comparatively illustrating the sequential sampling signal segments carried out by the respective ADC channels recursively over a series of sampling cycles;

DETAILED DESCRIPTION OF THE PREFERRED EMBODIMENTS

Figure 1:
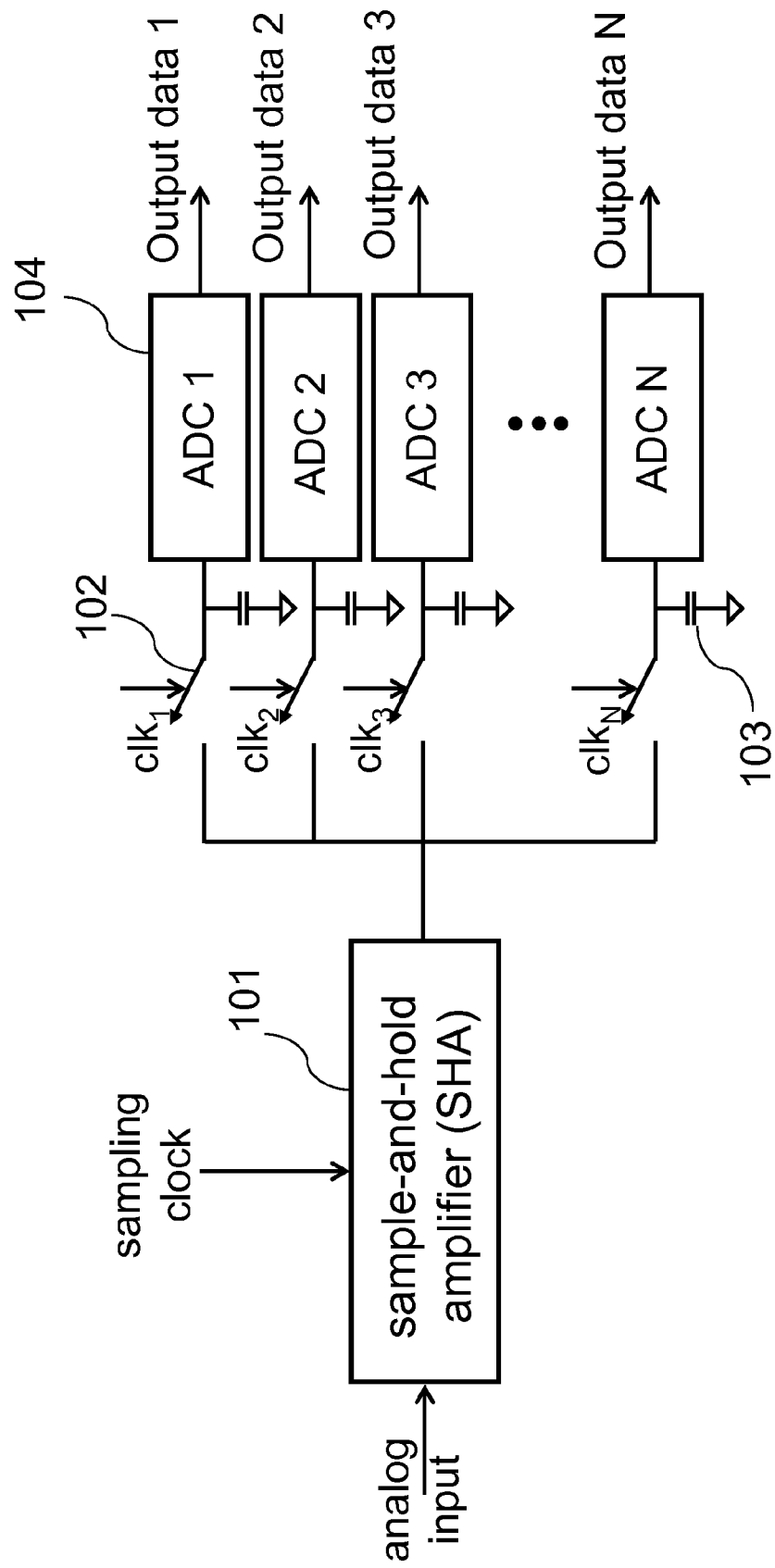
FIG. 1 is a schematic block diagram illustrating a conventional time interleaving ADC topology having a global front-end sample-and-hold amplifier circuit.

Generally, the disclosed system and method provide for adaptive self-calibration to compensate for timing skews occurring in the sampling time windows (or apertures) of the individual ADC channels in multi-channel time interleaved analog-to-digital conversion. In accordance with certain exemplary embodiments of the present invention, each of the ADC channels samples a given analog signal during a sampling time window/aperture, so that the sample is taken from that segment of the analog signal delineated by the sampling time window. During a sampling cycle, the ADC channels sequentially sample the analog signal within a consecutive series of such sample segments of that analog signal, and generate respective sample outputs therefor. Once each of the ADC channels has carried out such operation, another sampling cycle is carried out where the process is recursively repeated for the next consecutive series of sample segments of the analog signal. A frame of sample segments is sequentially sampled and converted in this manner during each sampling cycle of operation. This is repeated over a series of sampling cycles until the error estimates sufficiently converge to tolerable levels (as determined according to the particular requirements of the intended application).

The subject system and method preferably carry out the self-calibration during a sampling cycle for each sample segment in a frame. The timing skew error for each sample segment is estimated based on the sampled outputs of the ADC channels themselves for a certain group of neighboring sample segments, without resort to extraneous data specially acquired toward that end (whether by dedicated allocation of an ADC channel or otherwise). The group of neighboring sample segments considered in the estimation includes at least one sample segment preceding a given sample segment and at least one sample segment succeeding the given sample segment. Preferably, the immediately preceding and succeeding sample segments are considered for simple, computationally light estimation of the time derivative of the analog signal at the instant it was sampled during the given sample segment.

In accordance with certain exemplary embodiments of the present invention, various assumptions and approximations are exploited to realize computational expediencies in this neighbor-based adaptive estimation of the timing skew error for each sample segment of a frame. The adaptive estimation of error for each sample segment is defined according to a generalized linear combination of estimated errors and observed sample outputs attributable to the neighboring sample segments. The generalized definition is readily applicable to any suitable number of sample segments in a frame greater than two, making the adaptive error estimation scalable to systems employing corresponding numbers of parallel ADC channels.

The timing skew error estimates obtained may be applied to one or more suitable timing control units to remedially adjust the sample timing in each of the ADC channels as needed. For example, a digitally programmable delay is actuated responsive to the estimated error estimate for an ADC channel to appropriately adjust the clock which drives the sampling switch in that channel.

Figure 2A:
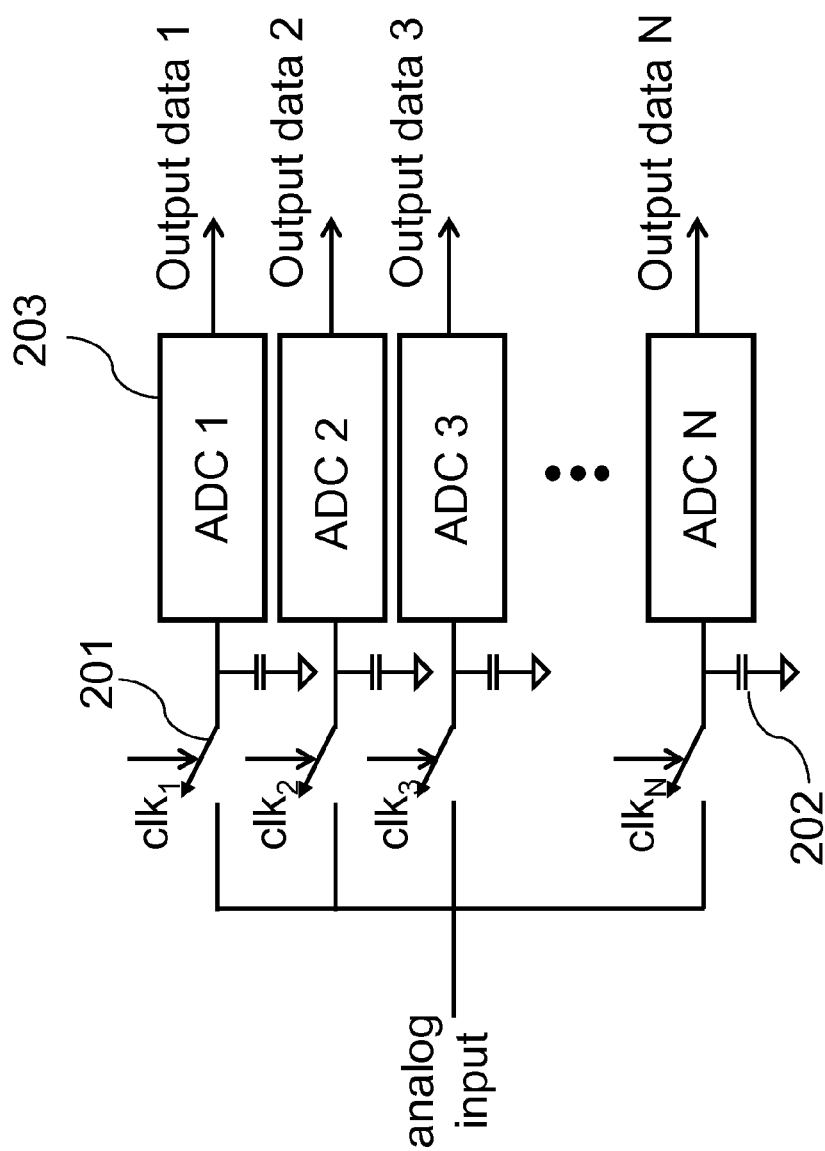
FIG. 2a is a schematic block diagram illustrating a portion of a time interleaving ADC topology employing a plurality of parallel ADC channels each served by a corresponding input sampling circuit.
Figure 2B:
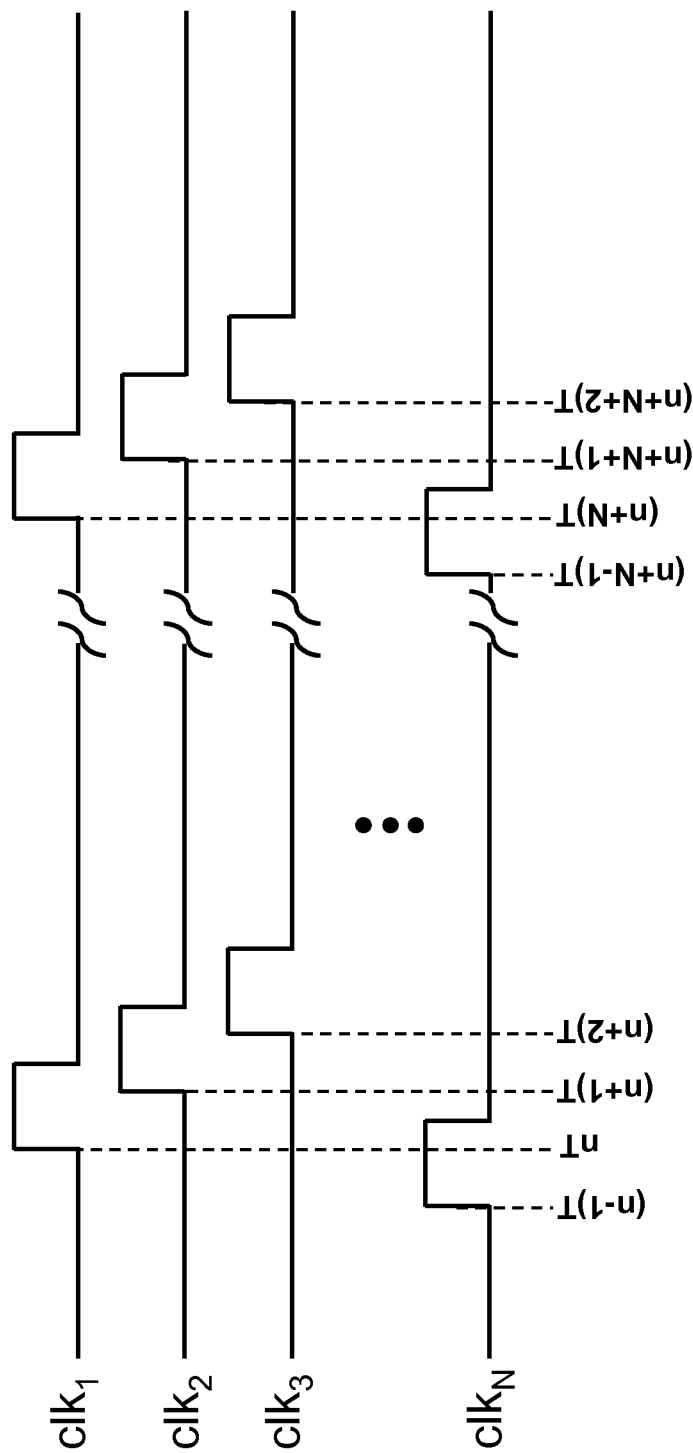

Referring now to FIGS. 2a-2b, certain portions of a time interleaving parallel ADC topology which does not use a front-end SHA are illustrated. The timing (clock signals) associated with the individual ADC channels in this system are illustrated in FIG. 2b. In the timing diagrams shown, T represents the sampling interval, or the duration of one sampling cycle, for the overall parallel ADC (comprising the collective ADC channels). It is assumed for the purposes of illustration that the input analog signal is sampled on the rising edges of the clock signals $clk_1$, $clk_2$, ..., $clk_N$ which in this example represent phase offset versions of the same clock signal. The pulse duration of these clock signals may be different from one ADC architecture to another, but each ADC channel samples the analog input signal according to the mutually phase offset versions of the same predetermined clock.

When its turn arrives, each ADC channel samples directly the input analog signal at a rate equal to the full sampling speed of the overall ADC divided by the number of channels N. Because the input analog signal is changing over time when it is sampled, any timing skew between the clock signals $clk_1$, $clk_2$, ..., $clk_N$ of the individual ADC channels results in non-uniform sampling. This in turn results in the overall ADC's digital output exhibiting errors after being reconstructed from the individual channel outputs.

FIG. 3a-3b illustrate the sampling of the analog input signal 301 under ideal conditions, in the example of a four channel interleaved ADC system application. As shown schematically in FIG. 3a, the analog signal 301 is ideally sampled in turn, at uniform time intervals, by the four ADC channels. The signal 301 is thus 'uniformly' sampled at the sample segments n−4, n−3, n−2, n−1 (at the beginning of each segment in this particular example, since sampling is assumed on the rising edge of the sampling clock signal) during one sampling cycle. The ADC channels then sample the signal 301 at the sample segments n, n+1, n+2, n+3 during the immediately following sampling cycle. This process is recursively repeated over the ongoing series of sample segments for each frame of four consecutive sample segments.

FIG. 3b illustrates the sample components thus obtained by each of the ADC channels for combined time-interleaved conversion. The samples (and their sample segments) taken by the four ADC channels at the outputs of their individual S/H circuits during the same sampling cycle are shown collectively aligned in time. In this figure, it is assumed in the interests of clarity and brevity that the sampling clock cycle T is equal to 1 second and ADC channel 1 samples the analog input signal 301 at the time instants (n+4·i), channel 2 at the time instants (n+4·i+1), channel 3 at the time instants (n+4·i+2), and channel 4 at the time instants (n+4·i+3), where i and n represent integer indices.

Therefore, denoting by u(t) the continuous time input signal 301 of the ADC, by y[n] the discrete time signal obtained by sampling u(t), and by $y_k[n]$ the discrete time signal at the output of sampler in ADC channel k, the various signals in question may be represented as follows for an ADC system employing N ADC channels:

$$y[n]=u(nT) \tag{1}$$

$$y_k[n]=y[n+k-1], k=1,\ldots,N \tag{2}$$

If the sampling clock is affected by timing errors—that is, if the n-th sample is taken at the skewed time instant nT+Δt instead of precisely at time instant nT, the sampled output may be represented as follows:

$$\tilde{y}[n] = u(nT+\Delta t) \approx u(nT) + \Delta t \cdot u'(nT) \quad (3)$$

Due to various circuit and implementation factors (like imprecise clock frequency generation circuit and delays in the distribution of a clock for the different channels), each ADC channel is typically characterized by a different sample timing error. The sampling output of ADC channel k may therefore be represented as follows:

$$\tilde{y}_k[n] = u((n+k-1)T+\Delta t_k) \approx u((n+k-1)T) + \Delta t_k \cdot u'((n+k-1)T), k=1, \ldots, N \quad (4)$$

The effects of the sampling timing error on the overall ADC performance may be significant. To correct for such error, the system must be responsively calibrated.

Calibration to reduce sampling time aperture errors generally involves two main processes: detection and correction. These processes may be carried out either in the analog domain (before the signal is converted) or in the digital domain (after the signal is converted). The digital domain is generally preferred for the detection of errors to avoid loading sensitive analog signal path with additional circuitry for error detection. Also, multiple sub-blocks may contribute to the final error affecting the ADC, therefore detecting the error on the final output is preferable.

Figure 4:
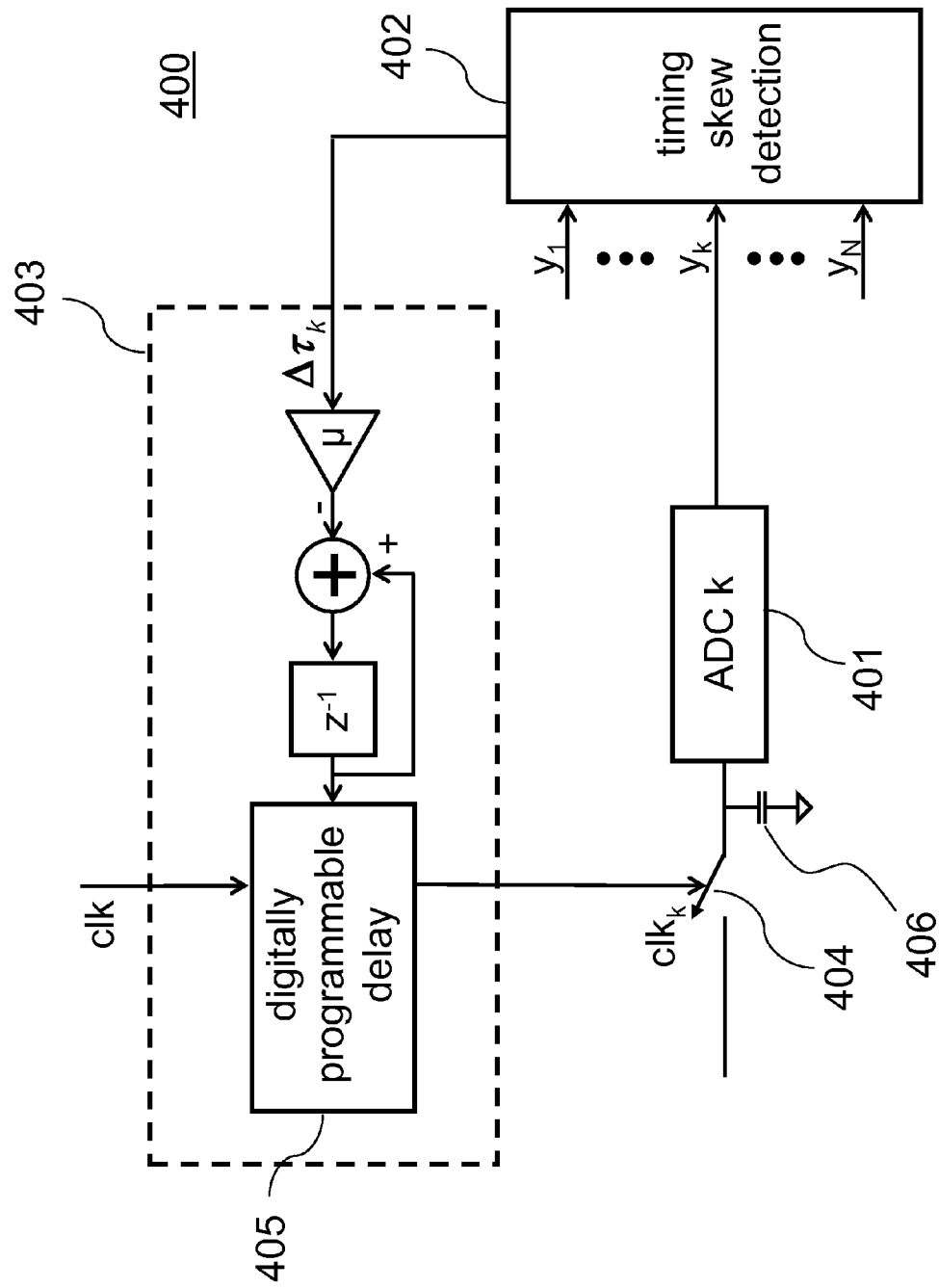
FIG. 4 is a schematic block diagram illustrating a representative portion of self-calibration system formed in accordance with one exemplary embodiment of the present invention, as implemented in one of N parallel ADC channels of a time interleaved ADC system.

In this regard, digitally programmable analog delay lines are preferably employed to apply delays as needed to align the sampling clocks in the ADC channels. This is shown in FIG. 4 which schematically illustrates a self-calibration system 400 formed in accordance with one exemplary embodiment of the present invention. For clarity and brevity, a calibration loop for just one ADC channel, namely channel k, of the N total parallel ADC channels employed in the system is representatively shown. Calibration loops for the other ADC channels 1 . . . k−1, k+1, . . . N are formed with like configuration in the disclosed embodiment.

As shown, system 400 includes N parallel ADC channels, each channel having an ADC unit 401 equipped with a sample and hold (S/H) circuit, the S/H circuit being formed by a sampling switch 404 and a sampling capacitor 406. The sampling switch 404 of each ADC channel k is driven by the appropriately phased version of the sampling clock signal for that ADC channel k. System 400 also includes a timing skew detection unit 402 which receives sampled outputs from each of the ADC channels 1, . . . N and adaptively generates for each ADC channel k an estimate of the timing skew error $\Delta \tau_k$ for the sample segment served by that ADC channel k during a given sampling cycle. As described in following paragraphs, the timing skew error estimate $\Delta \tau_k$ is generated based on the signals normally made available at the outputs of the ADC channels' conversion units 401. Preferably, unit 402 generates the estimates without requiring the extraneous acquisition of data specifically for calibration through dedicated data acquisition channels or otherwise.

The timing skew error factor $\Delta \tau_k$ provided by unit 402 for each ADC channel's sample segment is then passed to a timing control unit 403 preferably coupled in feedback manner to each of the ADC channels' S/H circuits. The timing control unit 403 preferably includes a digitally programmable delay cell 405 that is controlled responsive to the received timing skew error factor $\Delta \tau_k$ to adjustably delay the main sampling clock clk as needed. The given channel's sampling switch 404 is thereby driven by the skew-adjusted sampling clock signal clk$_k$. Timing control unit 403 employs suitable measures known in the art, such least means squares (LMS), to determine the appropriate delay for application to the sampling clock based on the timing skew error factor $\Delta \tau_k$. Depending on the particular requirements of the intended application, timing control unit 403 may be implemented to separately serve each ADC channel or may be implemented to serve multiple channels in time shared manner.

The calibration loop illustrated in FIG. 4 for an ADC channel operates based on the following relationship:

$$D_k^{(i+1)} = D_k^{(i)} - \mu \cdot \Delta \tau_k^{(i)}$$

where $D_k^{(i)}$ represents the delay provided by the clock delay cell 405 for channel k at iteration step i, $\Delta \tau_k^{(i)}$ represents the factor containing the sampling time error estimate of channel k at iteration step i, and μ represents a predetermined adaptive loop gain factor. The detection unit 402 processes the digital outputs of all the N parallel ADC channels and generates estimates for the sampling time errors $\Delta \tau_k$, k=1, . . . , N.

As noted, the adaptive feedback loop defined by the timing control unit 403 correctively adjusts the time delays of the sampling clock signals clk$_k$ in the ADC channels using digitally programmable delay cells 405 such that all sampling time errors are minimized. The self-calibration loop shown in FIG. 4 may be configured to execute in the background, while the overall ADC system carries out its time-interleaved conversion of the analog input signal. After the self-calibration process converges, its operation may be turned off and selectively run again from time to time to compensate for possible timing skew drifts. This self-calibration process remains readily available on-demand for such selective actuation, for it calibrates based on sampling time aperture error estimates obtained from the normal operational outputs of its own ADC channels.

Eq. (3) indicates that the amplitude error of the sampled signal ỹ[n] due to sampling time skew is proportional to the time derivative of the continuous-time input signal u(t) at the sampling instant, as well as to the sampling time error itself. One way to obtain a measure for the sampling time error is to compute an estimate for the time derivative of the input signal u'(nT), and multiply the same with the sampled signal output ỹ[n] of the given ADC channel, then average the resulting product for a suitably long time to obtain a DC, or expected, value. The results of this operation are found to be proportional to the product between the timing error factor Δt and the root mean square (RMS) value of the time derivative of the input signal u(t). Assuming u(t) to be a stationary or quasi-stationary signal, this derivative quantity may be used in calibrating the delay cells 405 illustrated in FIG. 4.

The time derivative of the continuous-time input signal at the time of its sampling may be approximated by computing the first-order difference between samples obtained in two neighboring samples, preferably the adjacent samples. Accordingly, an estimate of the time derivative of the input analog signal 301, expressed u(t), for a sample segment is obtained in the disclosed embodiment in computationally expedient manner, based on the difference between samples obtained for its neighboring sample segments. The neighboring sample segments include at least one preceding sample segment and at least one succeeding sample segment, preferably the ones immediately preceding and immediately succeeding. This approach presumes that the continuous-time signal is sampled with a frequency satisfying the Nyquist sampling theorem, which requires the signal to be band-limited and the sampling frequency to be at least twice the maximum frequency component of the given signal. Assuming that the Nyquist requirement is satisfied, the time derivative of the input analog signal u(t) attributable to a sample segment n may be estimated according to the following:

$$u'(nT) \approx \frac{u((n+1)T) - u((n-1)T)}{2T} = \frac{y[n+1] - y[n-1]}{2T} \quad (5)$$

The expected value (or long term average) E{ } of the product between the output sample and the first order difference of its sampled input signal is then defined by:

$$E\{\tilde{y}[n] \cdot [u(nT+T) - u(nT-T)]\}$$

where ỹ[n] is defined according to Eq. (3). Based on the following relationship between $R_{xx}(t)$, the auto-correlation function of a signal x(t):

$$R_{xx}(t) = E\{x(t_0)x(t_0-t)\},$$

the expected value for a given sample segment may be defined as follows:

$$E\{\tilde{y}[n] \cdot [u(nT+T) - u(nT-T)]\} = -2\Delta t \cdot R'_{uu}(T), \quad (6)$$

where Δt represents the sampling time error in Eq. (3), and T represents the period of a sampling cycle. Since the time derivative of the auto-correlation function remains negative for T>0, the quantity resulting from Eq. (6) in this example must be positive in value, and may be used in an adaptive loop to cancel the sampling time error.

However, in a parallel ADC system such as illustrated in FIG. 2, the output samples y[n+1] and y[n−1] are themselves affected by timing errors in their channels; therefore, the derivative estimate of Eq. (5) is not accurate. The actual estimate of the derivative of the input signal at the sampled instant is better defined by:

$$\tilde{u}(nT) = \frac{\tilde{y}[n+1] - \tilde{y}[n-1]}{2T} \quad (7)$$

Figure 5A:
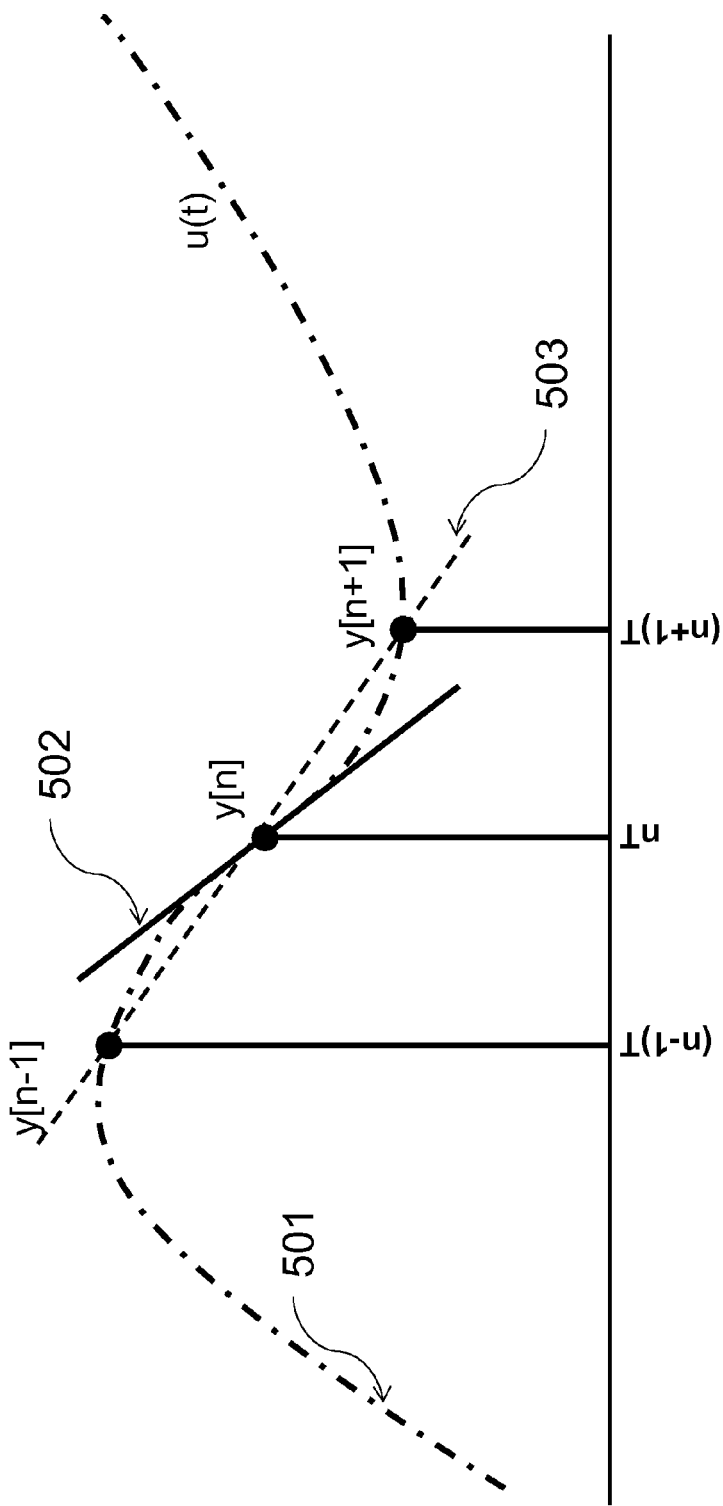
FIG. 5a is a timing diagram schematically illustrating an approximation error, in a uniformly sampled case, in estimating a time derivative of a continuous-time signal at one sampling point based on the difference between neighboring samples.
Figure 5B:
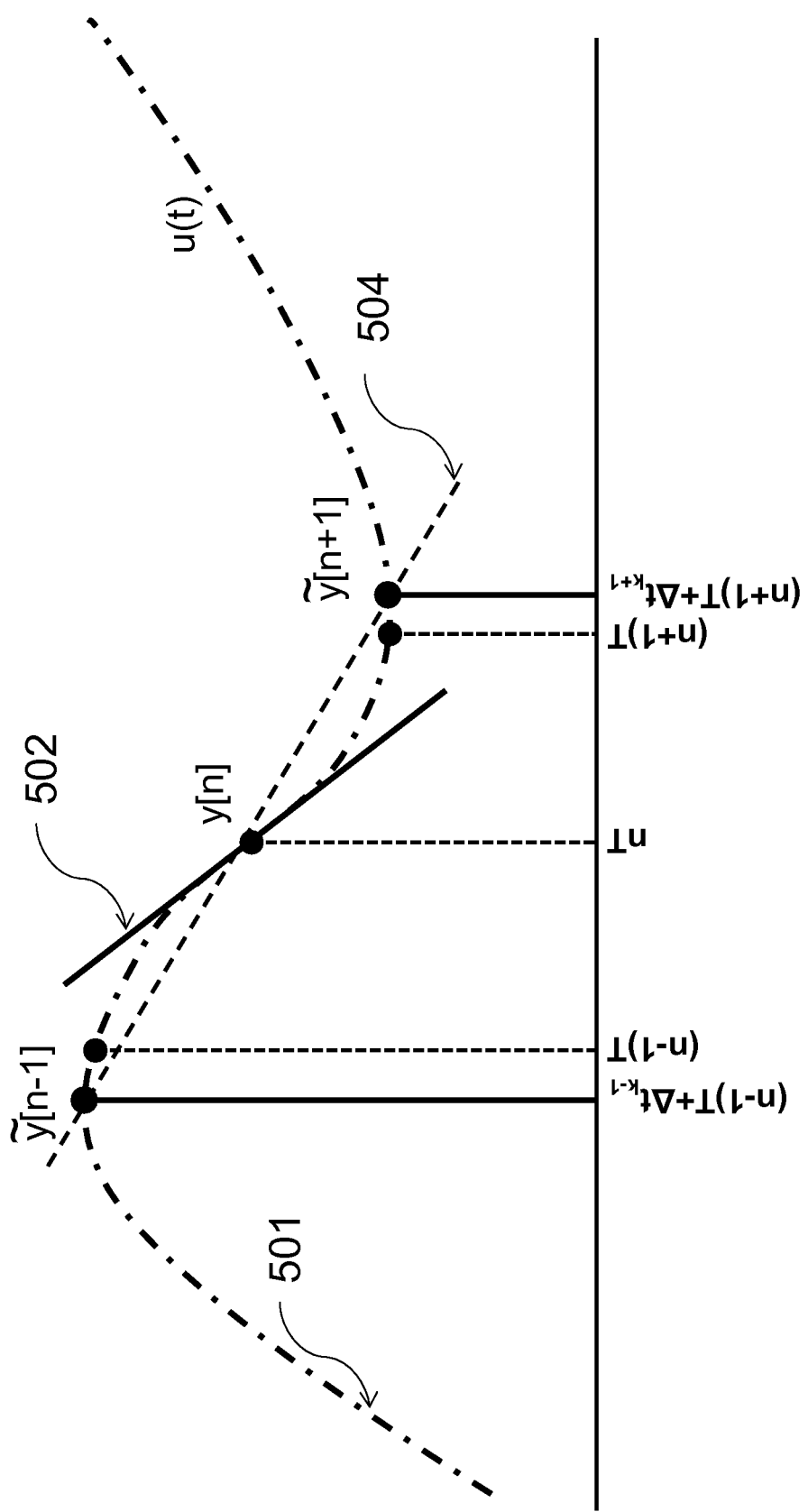
FIG. 5b is a timing diagram schematically illustrating an approximation error, in a non-uniformly sampled case affected by sampling time errors, in estimating a time derivative of a continuous-time signal at one sampling point based on the difference between neighboring samples.

FIG. 5a schematically illustrates the approximation error, even in the ideally sampled case, in computing the derivative of a continuous-time signal 501, denoted u(t), based on the first order difference of its ideal samples. Line 502 represents the signal's precise time derivative at time t=nT, whereas line 503 represents the signal's estimated time derivative obtained according to Eq. (5). FIG. 5b schematically illustrates the approximation error in computing the derivative of u(t) becoming even larger in the non-ideal case, when samples are affected by sampling time errors in the sampling channel. Line 502 represents the input signal's precise derivative at time t=nT, while line 504 represents the derivative as estimated according to Eq. (7).

In a parallel ADC system employing three or more channels, the output samples ỹ[n+1] and ỹ[n−1] for the sample segments immediately neighboring the current sample segment at t=nT are generated by the ADC channels adjacent the current sample segment's ADC channel. Therefore, if ADC channel k generates the sample output ỹ[n], then ỹ[n+1] represents the sample output of ADC channel k−1, whereas the sample output ỹ[n+1] represents the output of ADC channel k+1. Since each channel is characterized by its own sampling time error, their respective sample outputs may be expressed as follows:

$$\tilde{y}[n] = \tilde{y}_k[n] = u(nT + \Delta t_k) \approx u(nT) + \Delta t_k \cdot u'(nT) \quad (8)$$

$$\tilde{y}[n-1] = \tilde{y}_{k-1}[n] = u((n-1)T + \Delta t_{k-1}) \approx u((n-1)T) + \Delta t_{k-1} \cdot u'((n-1)T) \quad (9)$$

$$\tilde{y}[n+1] = \tilde{y}_{k+1}[n] = u((n+1)T + \Delta t_{k+1}) \approx u((n+1)T) + \Delta t_{k+1} \cdot u'((n+1)T) \quad (10)$$

If the ideal samples of the input signal u(nT+T) and u(nT−T) in Eq. (6) are respectively replaced by the actual output samples ỹ[n+1] and ỹ[n−1] from Eqs. (8)-(10), the expected value is defined as follows:

$$E\{\tilde{y}[n] \cdot [\tilde{y}[n+1] - \tilde{y}[n-1]]\} \approx (\Delta t_{k-1} - 2\Delta t_k + \Delta t_{k+1}) \cdot R'_{uu}(T) \quad (11)$$

Eq. (11) indicates the expected value of the product—between the output sample of channel k and the difference between the output samples of its adjacent neighbors (which represents a rough approximation of the derivative of the input signal for channel k)—to be a function not only of the sampling time mismatch in channel k, but also of the sampling time mismatch in its neighboring channels.

The approximations and equalities noted in preceding paragraphs are preferably incorporated in the self-calibration carried out in accordance with certain aspects of the present invention. The timing self-calibration process begins preferably with computation of the error signals $X_k$, for k=1, . . . , N as defined by:

$$X_k = E\{\tilde{y}_k[n] \cdot [\tilde{y}_{k+1}[n] - \tilde{y}_{k-1}[n]]\}, k=1, \ldots, N \quad (12)$$

Figure 6:
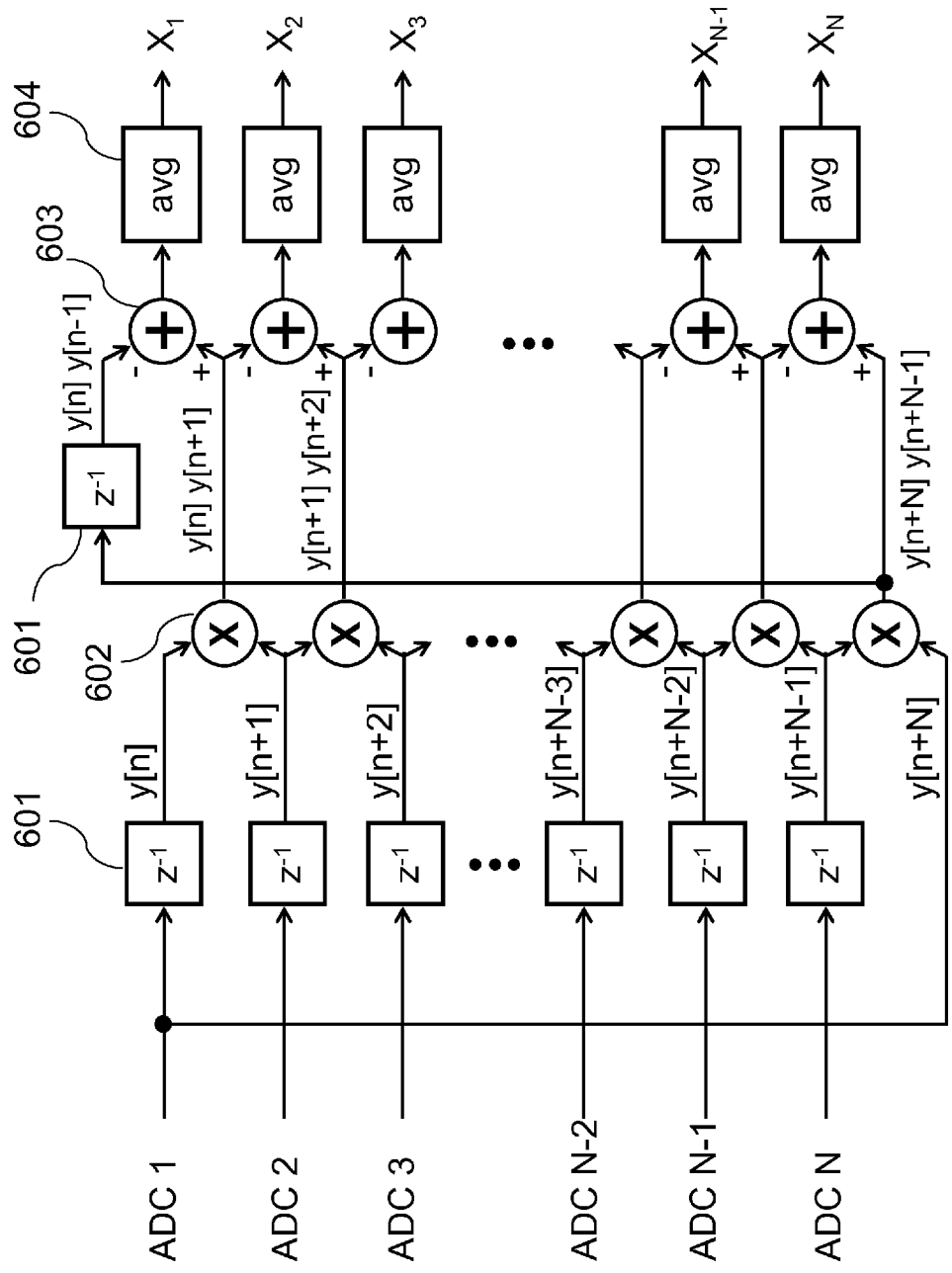
FIG. 6 is a schematic block diagram illustrating one exemplary embodiment of a scalable signal processing configuration implemented in a timing skew detection portion of the illustrative system embodiment of FIG. 4, for estimating an average error signal in each of N ADC channels based on data outputs of neighboring channels.

FIG. 6 schematically illustrates one example of a signal processing configuration which may be integrated in the timing skew detection unit 402 to carry out the computation of these error signals $X_k$. In this example, the outputs of the N parallel ADC channels are synchronized according to the same clock having a frequency equal to the overall ADC sampling rate divided by the number of ADC channels. The outputs of the ADC channels are processed by N digital delay cells 601, N digital multipliers 602 and N digital adders 603 intercoupled as shown to generate the products $\tilde{y}_k[n] \cdot [\tilde{y}_{k+1}[n] - \tilde{y}_{k-1}[n]]$, for k=1, . . . , N. The products for each of the channels' sample segments by corresponding averaging cells 604 to obtain the expected value for each sample segment. The adders, multipliers, and cells 603, 602, 601, 604 shown may be integrated in any suitable manner known in the art.

Depending on the particular application intended, the products $\tilde{y}_k[n] \cdot [\tilde{y}_{k+1}[n] - \tilde{y}_{k-1}[n]]$ do not need to be evaluated at every clock cycle. These values may be computed at a lower rate, where suitable, in order to save computational power. In certain alternate embodiments, moreover, power consumption and complexity of the calibration circuitry may be reduced even further by taking into account just the sign/polarity (positive or negative) of the time derivative estimated for the input signal in computing the error signals. The error signals in such alternate embodiments could then be defined according to the following simplified expression:

$$X_k = E\{\tilde{y}_k[n] \cdot \text{sign}[\tilde{y}_{k+1}[n]]\}, k=1, \ldots, N \quad (13)$$

This alternate approach would undoubtedly decrease accuracy of sampling time error estimation and thereby reduce the overall ADC system's performance. As such, the approach may only be suitable for low to medium resolution ADC systems.

The relationship between the error signals $X_k$ and the sampling time errors $\Delta t_k$ may be equivalently represented in matrix form as follows:

$$X = R'_{uu}(T) \cdot \begin{bmatrix} -2 & 1 & 0 & \ldots & 0 & 0 & 1 \\ 1 & -2 & 1 & \ldots & 0 & 0 & 0 \\ 0 & 1 & -2 & \ldots & 0 & 0 & 0 \\ \vdots & \vdots & \vdots & \vdots & \vdots & \vdots & \vdots \\ 0 & 0 & 0 & \ldots & -2 & 1 & 0 \\ 0 & 0 & 0 & \ldots & 1 & -2 & 1 \\ 1 & 0 & 0 & \ldots & 0 & 1 & -2 \end{bmatrix} \cdot \Delta t = R'_{uu}(T) \cdot A \cdot \Delta t \quad (14)$$

where X and Δt represent N-sized column vectors containing the respective values $X_k$ and $\Delta t_k$, and A represents the N×N weighting matrix indicated which weights accordingly the relative contributions of timing errors of the neighboring and current sample segments to the determination of the error signal values $X_k$.

Once the error signals are obtained, the self-calibration process computes estimates for the sampling time errors $\Delta t_k$ from the error signals $X_k$. Since the weighting matrix A of Eq. (14) is singular due to the timing errors not being independent, however, the matrix does not have an inverse. The required computations are nonetheless simplified by selecting one of the ADC sampling channels as a reference and calibrating the timing of the remaining N−1 channels with respect thereto. ADC channel 1, for instance, may be nominally taken as the reference, such that its relative sampling time error is necessarily zero. That is, $\Delta t_1 = 0$, and Eq. (14) may be simplified as follows:

$$X = R'_{uu}(T) \cdot \begin{bmatrix} 1 & 0 & \ldots & 0 & 0 & 1 \\ -2 & 1 & \ldots & 0 & 0 & 0 \\ 1 & -2 & \ldots & 0 & 0 & 0 \\ \vdots & \vdots & \vdots & \vdots & \vdots & \vdots \\ 0 & 0 & \ldots & -2 & 1 & 0 \\ 0 & 0 & \ldots & 1 & -2 & 1 \\ 0 & 0 & \ldots & 0 & 1 & -2 \end{bmatrix} \cdot \Delta t_r = R'_{uu}(T) \cdot A_r \cdot \Delta t_r \quad (15)$$

where $\Delta t_r$ represents the reduced (N−1)-sized vector containing the timing errors $\Delta t_k$ (k=2, ..., N) and $A_r$ represents a reduced N×(N−1) weighting matrix. The system as defined according to Eq. (15) is thus over-determined (N equations and N−1 unknowns), with X defined in terms of N−1 linear independent equations.

A problematic implication of this is that an infinite number of solutions are available for each timing error $\Delta t_k$, as various linear combinations of the error signals $X_k$. Note, however, that the farther away an ADC channel is located from the selected reference channel (in terms of its sampling segment), the greater its approximation error in estimating the derivative of the input signal for its sample segment. This fact is exploited to obtain the optimal solution for each timing error $\Delta t_k$. The disclosed self-calibration process thus obtains the timing errors $\Delta t_k$ (k=2, ..., N) starting with estimating first the timing errors of the channels/sample segments adjacent to the reference channel (or $\Delta t_2$ and $\Delta t_N$, where channel 1 is selected as the reference channel), and then moving computationally outward therefrom to determine the timing errors of the channels/sample segments progressively farther away from the reference channel.

Since there are an infinite number of solutions available for $\Delta t_2$ and $\Delta t_N$, the weight of error signal $X_1$ (associated with the reference channel 1) is maximized, then the weights are decreased progressively for the error signals associated with the other channels and their sampling segments, starting with the immediately neighboring channels and moving on out to the channels farther away. The same approach may be taken, regardless of how many additional channels are employed for a given application.

If the timing skew factor is defined for further computational simplicity as $\Delta \tau_k = R'_{uu}(T) \Delta t_k$, the optimal solution for Eq. (15) may be determined as follows:

(i) For those embodiments where the number of channels N is even:

$$\Delta \tau_N = \frac{1}{N} \sum_{k=1}^{N} \left( \frac{N+2}{2} - k \right) X_k \quad (16)$$

(ii) For those embodiments where the number of channels N is odd:

$$\Delta \tau_N = \frac{1}{N} \sum_{k=1}^{N} \left( \frac{N+1}{2} - k \right) X_k \quad (17)$$

On this basis, all the other timing skew factors may be estimated in a sequential manner according to:

$$\Delta \tau_2 = X_1 - \Delta \tau_N \quad (18)$$

$$\Delta \tau_k = X_{k-1} + 2\Delta \tau_{k-1} - \Delta \tau_{k-2}, k = 3, \ldots, \frac{N}{2} - 1$$

$$\Delta \tau_k = X_{k+1} + 2\Delta \tau_{k+1} - \Delta \tau_{k+2}, k = \frac{N}{2}, \ldots, N-1$$

Figure 7:
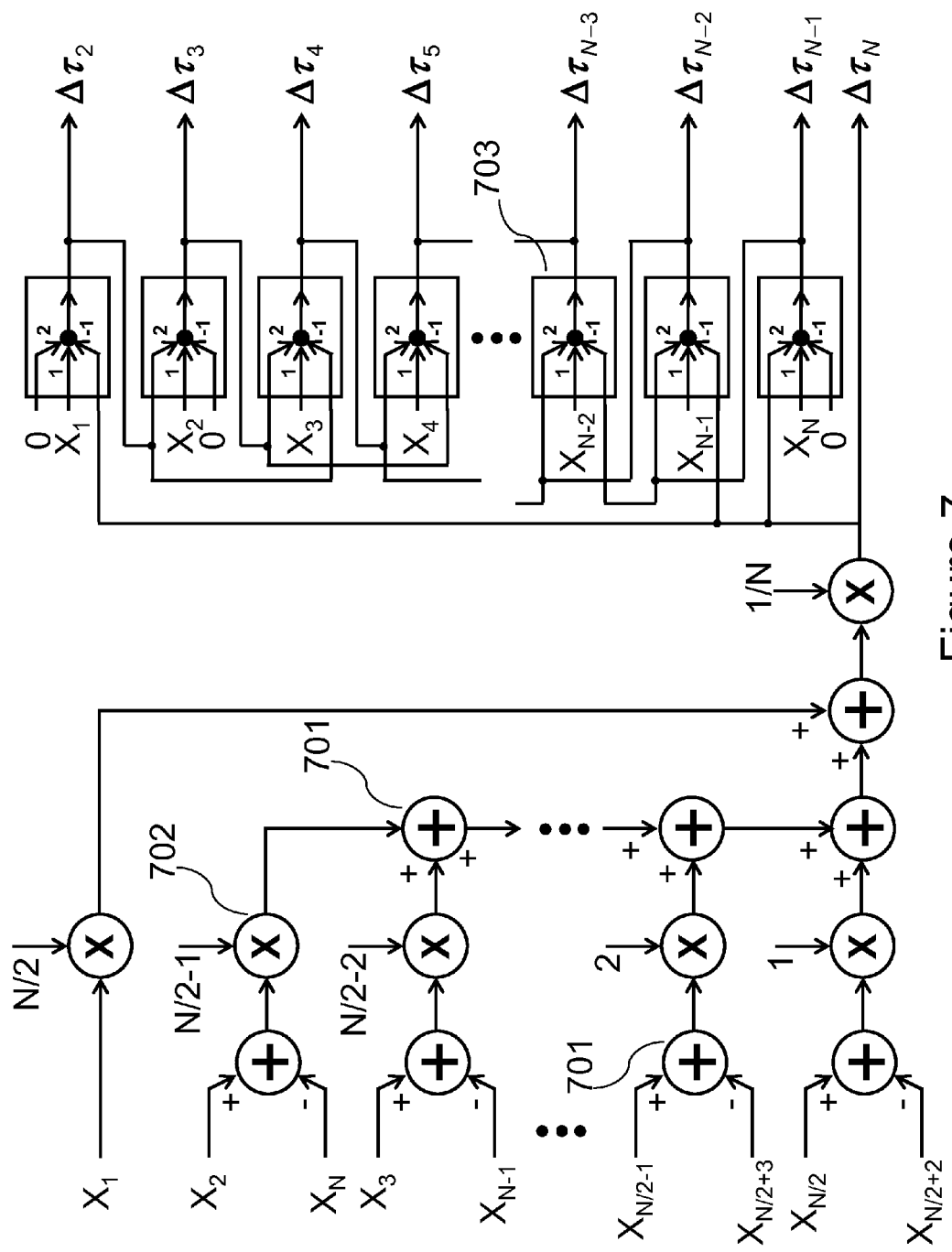
FIG. 7 is a schematic block diagram illustrating one exemplary embodiment of a scalable signal processing configuration implemented in a timing skew detection portion of the illustrative system embodiment of FIG. 4, for estimating a sampling time error factor for each of N ADC channels based on the average error signals shown in FIG. 6.
Figure 8:
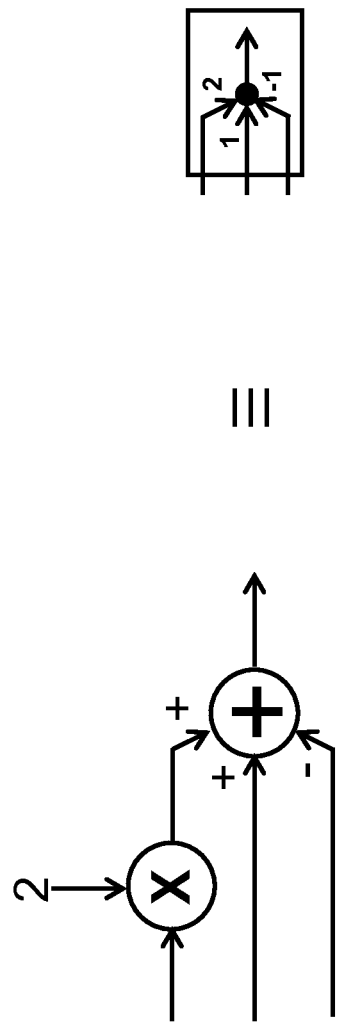
FIG. 8 is a schematic block diagram illustrating in greater detail a portion of the configuration shown in FIG. 7.

FIG. 7 schematically illustrates one example of a signal processing configuration which may be integrated in the timing skew detection unit 402 to carry out the computation of these timing skew factor estimates according to Eqs. (16)-(18), in the case of a system employing an even number of ADC channels. In this example, the error signals $X_1$-$X_N$ are combined accordingly by adders 701 and/or multipliers 702, and an array of N−2 three-input summing blocks 703. FIG. 8 illustrates the internal structure of each summing block 703 as implemented in one exemplary embodiment. The adders, multipliers, and blocks 701, 702, 703 may be integrated in any suitable manner known in the art, and various configurations other than those illustrated in FIGS. 7-8 may be suitably employed to implement the computations indicated by Eqs. (16)-(18) in a particular multi-channel application to estimate the timing skew factors for a frame of sample segments.

Each of the configurations shown in FIGS. 6-8 form but one of numerous implementations by which to generate the error signals $X_k$ and timing skew factors $\Delta \tau_k$ for self-calibration in accordance with the disclosed embodiment. Other suitable configurations may be employed, depending again on the particular requirements of the intended application.

In accordance with certain aspects of the present invention, the disclosed approach is scalable in the sense that such adaptive self-calibration may be systematically applied for optimal results in applications employing various numbers of parallel ADC channels for time interleaved ADC. The disclosed approach provides for such self-calibration without resort to dedicated channels or other extraneous measures to capture supplemental data for calibration purposes. While the disclosed approach involves certain approximations and trade-offs to preserve computational simplicity, it serves consistently to converge the sample timing skew in the different ADC channels down to minimal levels over recursive cycles of operation. This becomes increasingly beneficial as the number of channels increases beyond case of just a couple channels, for the exponential increase in computational burden to adaptively self-calibrate the multi-channel sampling of data would otherwise prove quickly prohibitive.

Figure 10:
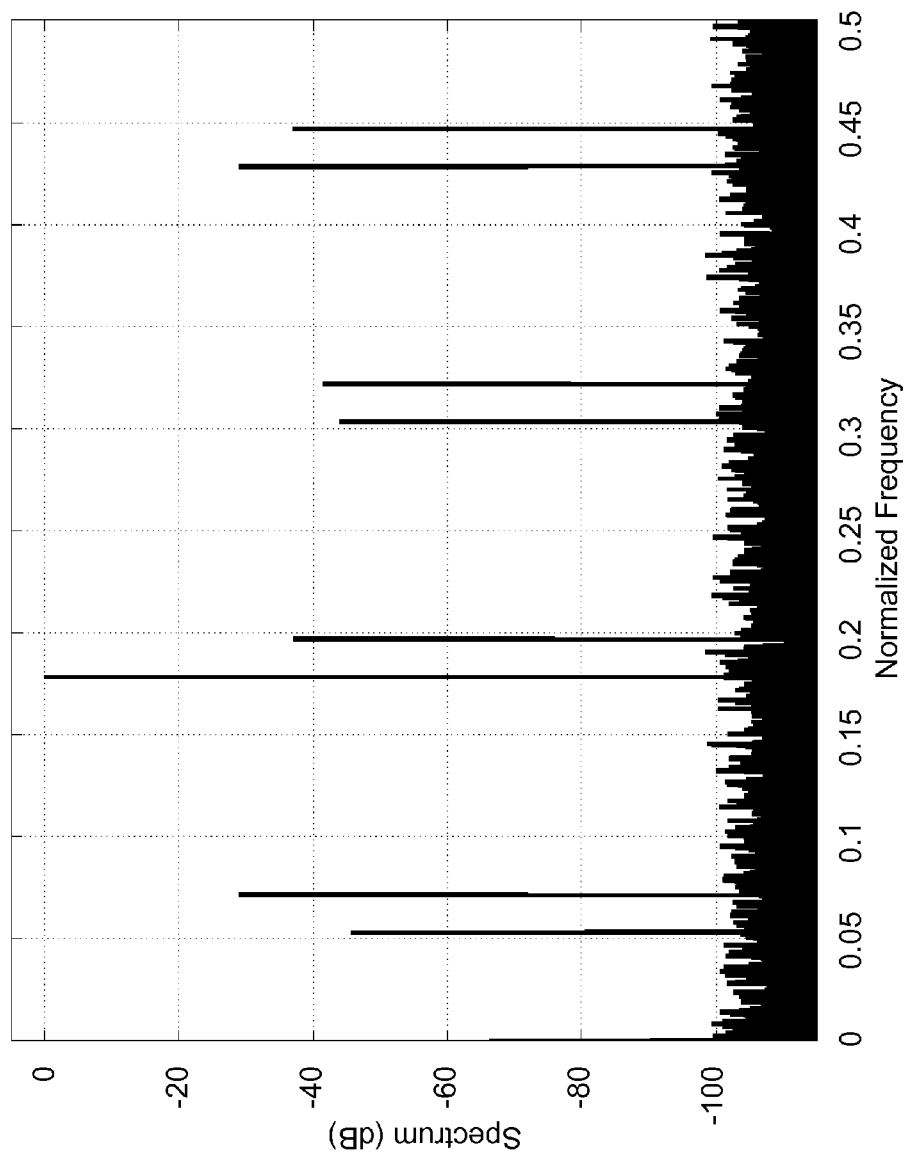
FIG. 10 is a graphic plot showing a frequency spectrum of a reconstructed sample signal at the output of an illustrative 8-channel, 12-bit parallel ADC test case of the embodiment shown in FIG. 4, without actuation of its self-calibration measures.
Figure 11:
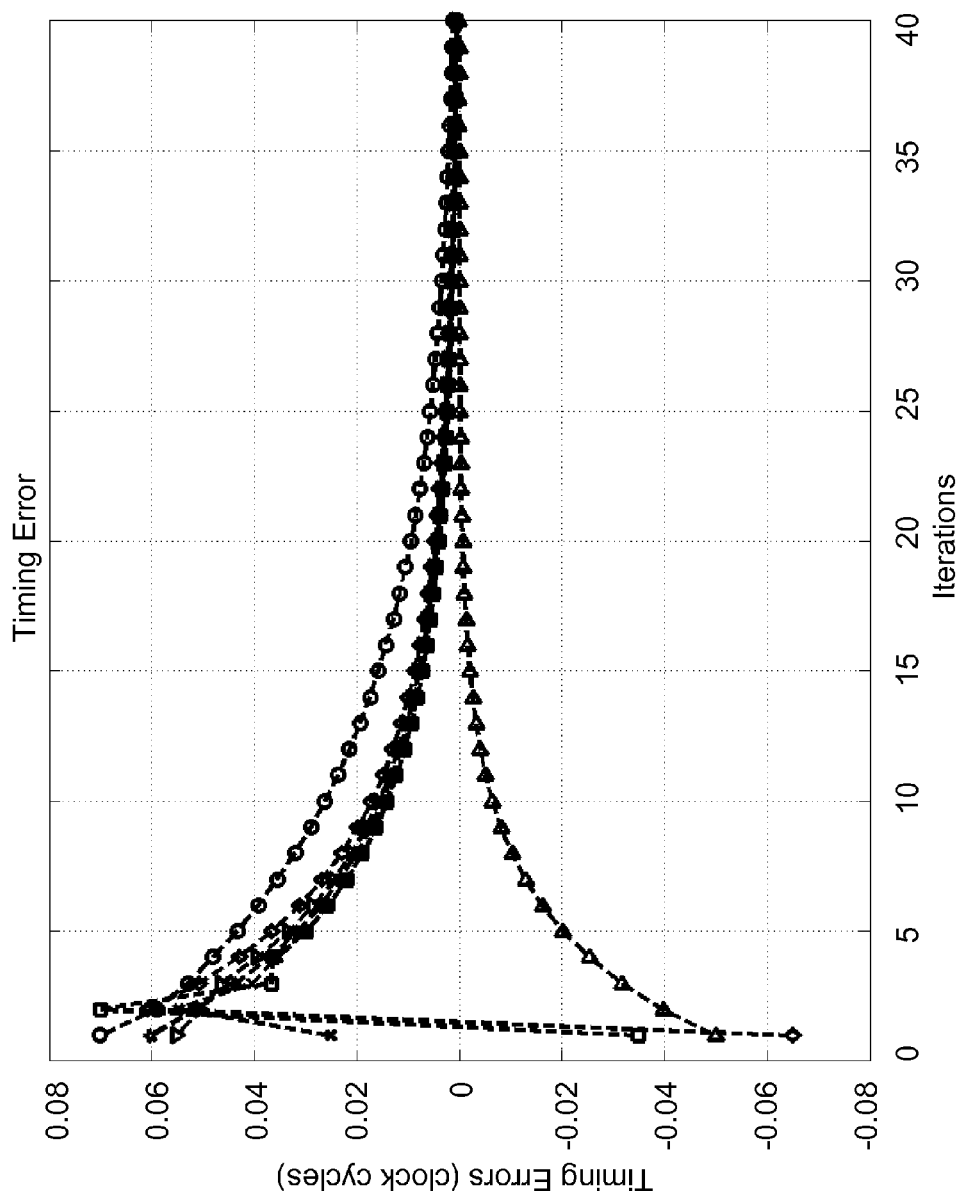
FIG. 11 is a graphic plot showing sampling time errors resulting in the respective ADC channels in the test case employed in FIG. 10, after self-calibration measures are actuated recursively over a series of iterations; and, FIG. 12 is a graphic plot showing a frequency spectrum of the same sample signal at the output of the same illustrative 8-channel, 12-bit parallel ADC test case of FIG. 10, but reconstructed after self-calibration measures are actuated recursively over a series of iterations as reflected in FIG. 11.
Figure 12:
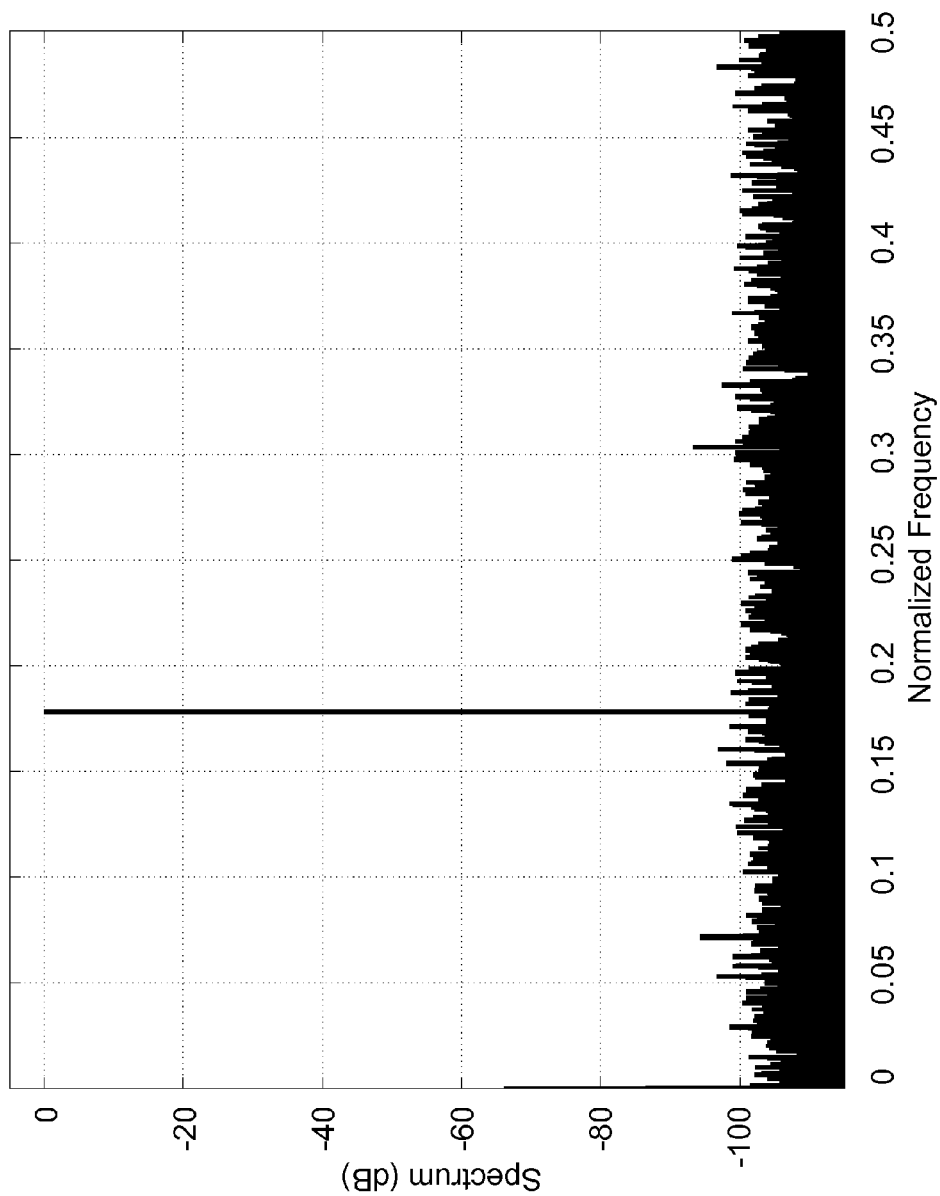

As described in following paragraphs with illustrative reference to FIGS. 10-12, disclosed approach has demonstrated highly effective results in removing the timing mismatch for cases employing three, four, eight and greater numbers of channels. Since the error estimates for the sample segments in question are computed based on linear combinations of factors derived from normal ADC channel outputs, the computational load is preserved at manageable levels, even with higher numbers of channels.

The estimated values of the sampling time errors thus obtained are preferably provided to respective feedback loops, whereby the variable delays of the clock delay cells 405 are responsively adjusted for each of the ADC channels, as shown in FIG. 4. The number of iterations required for the self-calibration loop to converge remains a function of the frequency content of the analog input signal to the ADC system. For higher frequency signals, the loop tends to converge more rapidly because their time derivatives are larger; the gain of the loop is therefore bigger. For lower frequency signals, the loop tends to converge less rapidly, but the calibration loop tends to yield more accurate results.

Figure 9:
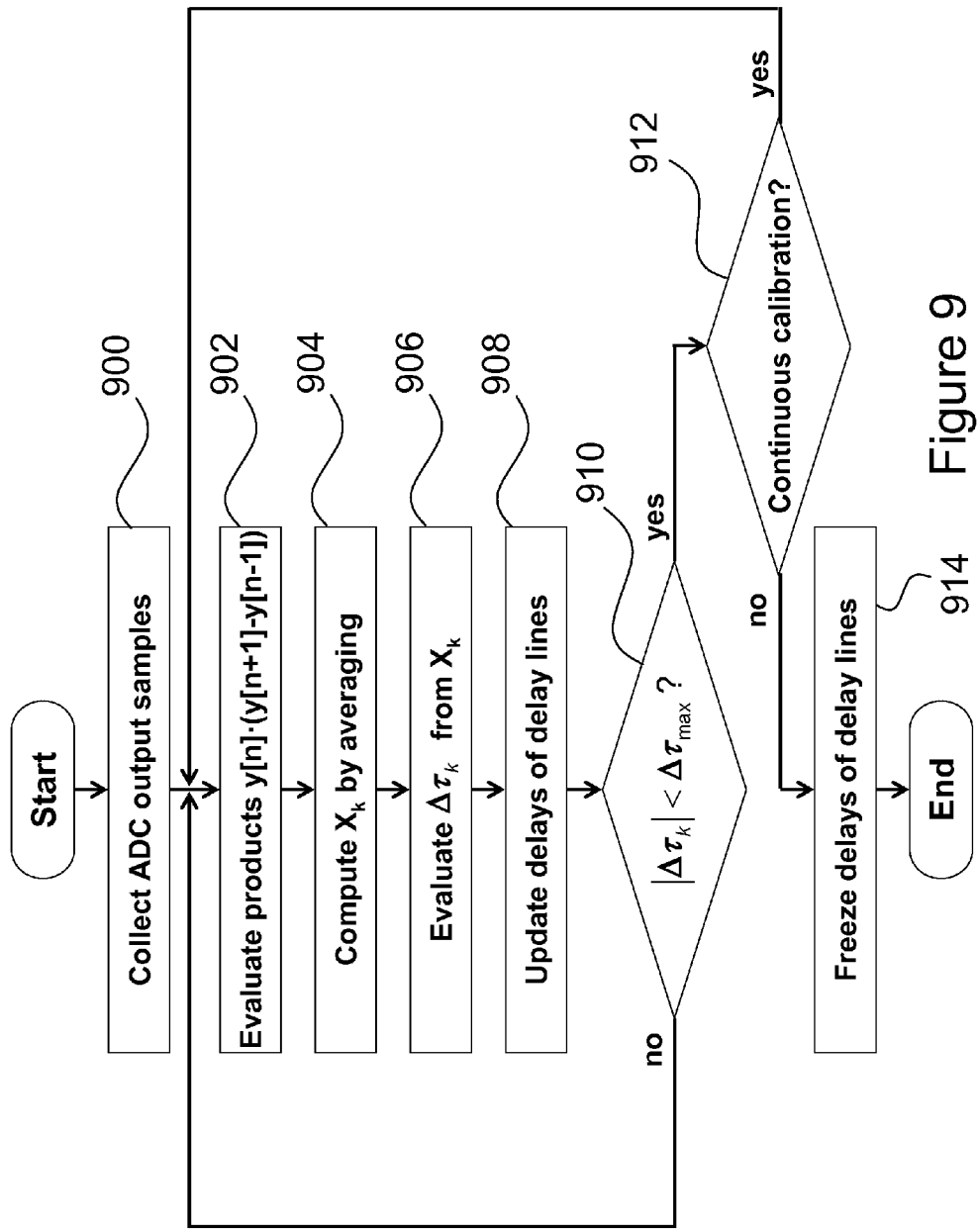
FIG. 9 is a flow diagram illustrating the general flow of processes carried out by the self-calibration system illustrated in FIG. 4 for multi-channel time-interleaved ADC.

Turning to FIG. 9, a flowchart is shown generally illustrating the flow of processes implemented in accordance with one exemplary embodiment of the present invention for executing self-calibration in a multi-channel time interleaved ADC system of the type illustrated in FIG. 4. The processes may be carried out by or under the control of a suitable computer processing device(s) to automatically compute and apply the timing skew factors for each ADC channel's sample segment during a sampling cycle. At block 900, the output samples of the N ADC channels during one sampling cycle are collected to establish a frame's worth of sample data. Neighbor-based computations are carried out at blocks 902-904 on the output sample data as described in preceding paragraphs to generate the set of error signal values $X_k$ for k=1, ..., N attributable to each sample segment of the given frame. The timing skew factors $\Delta\tau_k$ are then estimated at block 906 as described in preceding paragraphs based on the error signal values obtained at block 904. These timing skew factors are then applied at block 908 to the timing control measures 402 (of FIG. 4) to appropriately adjust the time delays respectively applied to the different ADC channel's sampling clock.

At block 910, each of the timing skew factors for the different ADC channels (and their sample segments within the given sampling cycle) is checked to determine if all the ADC channels' timing skew factors $\Delta\tau_k$, k=1, ..., N have dipped below a predetermined maximum timing skew level. If not, the flow returns to block 902 for recursive execution of timing skew factor estimation for another sampling cycle's frame of output sample data. Otherwise, the timing skew factors have all converged to tolerable levels, and the flow proceeds from block 910 to block 912, where the system has been set for continuous calibration. If so, the flow proceeds to bock 902 for continual recursive execution of timing skew factor estimation for subsequent sampling cycles. If the system has not been set for continuous calibration, the flow proceeds alternatively to block 914, where the timing delay lines are preserved at their most recent settings within the timing control measures 402.

As mentioned, the disclosed self-calibration is demonstrated to be highly effective for various multi-channel ADC applications. FIG. 10 illustrates for example the frequency spectrum of a signal at the output of an 8-channel, 12-bit parallel ADC system of the type illustrated in FIG. 4, before the disclosed self-calibration measures are actuated. The ADC input signal in this example was a sinusoidal analog signal having a frequency equal to $0.18 \cdot f_s$, with $f_s$ representing the effective sampling rate of the overall parallel ADC system. The output signal's spectrum erroneously exhibits multiple frequency components as a result of sampling time error in the ADC channels. FIG. 11 illustrates the convergence of the sampling time errors $\Delta t_k$, k=2, ..., 8, in the respective ADC channels after the disclosed self-calibration measures are actuated recursively over a series of iterations. This results in the properly sampled and reconstructed output signal, whose frequency spectrum is illustrated in FIG. 12. As expected, this spectrum exhibits just the one frequency component disposed at the proper normalized frequency of $0.18 f_s$.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular applications of elements may be reversed or interposed, all without departing from the spirit or scope of the invention as defined in the appended claims.

What is claimed is:

1. A system for adaptive self-calibration to remove sample timing error in time-interleaved analog-to-digital conversion (ADC) of an analog signal comprising:

a plurality of ADC channels recursively sampling the analog signal within a series of sample segments according to a predetermined sampling clock to generate a time-interleaved series of output samples, the output samples being combinable for digital reconstruction of the analog signal;

a timing skew detection unit coupled to said ADC channels, said timing skew detection unit generating for each sample segment a timing skew factor indicative of sampling clock misalignment within the sample segment, said timing skew detection unit generating the timing skew factor for each sample segment based adaptively on the output samples for a selective combination of segments thereabout including at least one preceding sample segment and at least one succeeding sample segment with reference to said sample segment; and, a plurality of timing control units respectively coupled to said ADC channels, said timing control units adjusting time delays for the sampling clock within respective sample segments responsive to corresponding ones of the timing skew factors generated by said timing skew detection unit;

whereby the series of sample segments is aligned substantially with the sampling clock.

2. The system as recited in claim 1, wherein the selective combination of segments for each sample segment includes the immediately preceding and immediately succeeding sample segments relative thereto.

3. The system as recited in claim 2, wherein the timing skew factor for each sample segment is determined in part on a rate of change in the analog signal thereat, the timing skew factor being estimated as a difference between the output samples of the immediately preceding and immediately succeeding sample segments.

4. The system as recited in claim 3, wherein a predetermined number N of said ADC channels are actuated in parallel during a plurality of recursive sampling cycles, said ADC channels during each sampling cycle generating output samples for a frame of N sample segments, said ADC channels sampling the analog signal within the frame of sample segments according to correspondingly phase offset versions of the predetermined sampling clock.

5. The system as recited in claim 4, wherein said timing skew detection unit includes an error signal generation portion and a timing skew estimator portion coupled thereto; said error signal generation portion including a plurality of digital delay, first digital multiplier, first digital adder, and averaging cells intercoupled for linearly combining and averaging the output samples received from said ADC channels to generate a set of error signals $X_k$ for the frame of sample segments, the set of error signals $X_k$ being defined according to:

$$X_k = E\{\tilde{y}_k[n] \cdot [\tilde{y}_{k+1}[n] - \tilde{y}_{k-1}[n]]\}, k=1, \ldots, N$$

where k represents a channel index iteratively denoting a particular sample segment within the frame of sample segments, n represents a sampling cycle index, N represents the total number of said ADC channels, $\tilde{y}[n]$ represents a value of the output sample at a particularly denoted sample segment and sampling cycle n, and E{ } indicates an averaging operation over a plurality of sampling cycles.

6. The system as recited in claim 5, wherein said timing skew estimator portion includes a plurality of second digital adder, second digital multiplier, and summing block cells for combining the error signals received from said error signal generation portion to generate a set of timing skew factors $\Delta\tau_k$ for the frame of sample segments, the set of timing skew factors $\Delta\tau_k$ being defined according to:

$$\Delta\tau_2 = X_1 - \Delta\tau_N$$

$$\Delta\tau_k = X_{k-1} + 2\Delta\tau_{k-1} - \Delta\tau_{k-2}, k = 3, \ldots, \frac{N}{2} - 1$$

$$\Delta\tau_k = X_{k+1} + 2\Delta\tau_{k+1} - \Delta\tau_{k+2}, k = \frac{N}{2}, \ldots, N-1$$

where:

$$\Delta\tau_N = \frac{1}{N}\sum_{k=1}^{N}\left(\frac{N+2}{2} - k\right)X_k$$

if N is even; and,
where:

$$\Delta\tau_N = \frac{1}{N}\sum_{k=1}^{N}\left(\frac{N+1}{2} - k\right)X_k$$

if N is odd.

7. The system as recited in claim 4, wherein said ADC channels recursively sample the analog signal at a sampling rate of $N \times f_c$, where $f_c$ represents the frequency of the sampling clock; and, the sampling rate is at least twice as high as a maximum frequency component of the analog signal.

8. The system as recited in claim 2, wherein each said ADC channel includes an input sampling switch driven according to the sampling clock; and, each said timing control unit defines a feedback loop including a programmable delay module adjusting the sampling clock for application to said input sampling switch of a corresponding one of said ADC channels responsive to the timing skew factor therefor.

9. The system as recited in claim 8, wherein said feedback loop of each said timing control unit executes Least Means Squares processing based on the timing skew factor received thereby.

10. A method for adaptive self-calibration to remove sample timing error in time-interleaved analog-to-digital conversion (ADC) of an analog signal comprising:
establishing a plurality of ADC channels to recursively sample the analog signal within a series of sample segments according to a predetermined sampling clock;
actuating said ADC channels to generate a time-interleaved series of output samples, the output samples being combinable for digital reconstruction of the analog signal;
executing a timing skew detection to generate for each sample segment a timing skew factor indicative of sampling clock misalignment within the sample segment, said timing skew detection generating the timing skew factor for each sample segment based adaptively on the output samples for a selective combination of segments thereabout including at least one preceding sample segment and at least one succeeding sample segment with reference to said sample segment; and,
executing timing control for each of said ADC channels, said timing control adjusting a time delay for the sampling clock within each sample segment responsive to a corresponding one of the timing skew factors generated by said timing skew detection;
whereby the series of sample segments is aligned substantially with the sampling clock.

11. The method as recited in claim 10, wherein the selective combination of segments for each sample segment includes the immediately preceding and immediately succeeding sample segments relative thereto.

12. The method as recited in claim 11, wherein the timing skew factor for each sample segment is determined in part on a rate of change in the analog signal thereat, the timing skew factor being estimated as a difference between the output samples of the immediately preceding and immediately succeeding sample segments.

13. The method as recited in claim 12, wherein a predetermined number N of said ADC channels are actuated in parallel during a plurality of recursive sampling cycles, said ADC channels during each sampling cycle generating output samples for a frame of N sample segments, said ADC channels sampling the analog signal within the frame of sample segments according to correspondingly phase offset versions of the predetermined sampling clock.

14. The method as recited in claim 13, wherein said timing skew detection includes an error signal generation process and a timing skew estimator process;
said error signal generation process executing a plurality of intercoupled digital delay, first digital multiplier, first digital adder, and averaging cells for linearly combining and averaging the output samples received from said ADC channels to generate a set of error signals $X_k$ for the frame of sample segments, the set of error signals $X_k$ being defined according to:

$$X_k = E\{\tilde{y}_k[n] \cdot [\tilde{y}_{k+1}[n] - \tilde{y}_{k-1}[n]]\}, k=1, \ldots, N$$

where k represents a channel index iteratively denoting a particular sample segment within the frame of sample segments, n represents a sampling cycle index, N represents the total number of said ADC channels, $\tilde{y}[n]$ represents a value of the output sample at a particularly denoted sample segment and sampling cycle n, and E{ } indicates an averaging operation over a plurality of sampling cycles.

15. The method as recited in claim 14, wherein said timing skew estimator process includes executing a plurality of intercoupled second digital adder, second digital multiplier, and summing block cells for combining the error signals received from said error signal generation portion to generate a set of timing skew factors $\Delta\tau_k$ for the frame of sample segments, the set of timing skew factors $\Delta\tau_k$ being defined according to:

$$\Delta\tau_2 = X_1 - \Delta\tau_N$$

$$\Delta\tau_k = X_{k-1} + 2\Delta\tau_{k-1} - \Delta\tau_{k-2}, k = 3, \ldots, \frac{N}{2} - 1$$

$$\Delta\tau_k = X_{k+1} + 2\Delta\tau_{k+1} - \Delta\tau_{k+2}, k = \frac{N}{2}, \ldots, N - 1$$

where:

$$\Delta\tau_N = \frac{1}{N}\sum_{k=1}^{N}\left(\frac{N+2}{2} - k\right)X_k$$

if N is even; and,
where:

$$\Delta\tau_N = \frac{1}{N}\sum_{k=1}^{N}\left(\frac{N+1}{2} - k\right)X_k$$

if N is odd.

16. The method as recited in claim 13, wherein said ADC channels are actuated to recursively sample the analog signal at a sampling rate of $N \times f_c$, where $f_c$ represents the frequency of the sampling clock; and, the sampling rate is at least twice as high as a maximum frequency component of the analog signal.

17. The method as recited in claim 11, wherein an input of each said ADC channel is switched by a sampling switch driven according to the sampling clock; and, each said timing control for each said ADC channel establishes a feedback loop including a programmable delay module adjusting the sampling clock for application to said input sampling switch responsive to the corresponding timing skew factor.

18. The method as recited in claim 17, wherein said feedback loop of each said timing control unit executes Least Means Squares processing based on the timing skew factor received thereby.

19. A system scalable to a variable multiplicity of channels for adaptive self-calibration to remove synchronization error in time-interleaved analog-to-digital conversion (ADC) of an analog signal comprising:
  a plurality of ADC channels recursively sampling the analog signal within a series of sample segments according to a predetermined sampling clock to generate a time-interleaved series of output samples, said ADC channels being actuated in parallel during a sampling cycle upon a frame of sample segments according to correspondingly phase offset versions of the predetermined sampling clock, the output samples being combinable for digital reconstruction of the analog signal;
  a timing skew detection unit coupled to said ADC channels, said timing skew detection unit generating for each sample segment a timing skew factor indicative of sampling clock misalignment within the sample segment, said timing skew detection unit generating the timing skew factor for the sample segment based adaptively on a rate of change in the analog signal thereat, the timing skew factor being estimated as a difference between the output samples of the immediately preceding and immediately succeeding sample segments;

wherein said timing skew detection unit includes an error signal generation portion and a timing skew estimator portion coupled thereto, said error signal generation portion including a plurality of digital delay, first digital multiplier, first digital adder, and averaging cells intercoupled for linearly combining and averaging the output samples received from said ADC channels to generate a set of error signals $X_k$ for the frame of sample segments, the set of error signals $X_k$ being defined according to:

$$X_k = E\{\tilde{y}_k[n] \cdot [\tilde{y}_{k+1}[n] - \tilde{y}_{k-1}[n]]\}, k=1, \ldots, N$$

where k represents a channel index iteratively denoting a particular sample segment within the frame of sample segments, n represents a sampling cycle index, N represents the total number of said ADC channels, $\tilde{y}[n]$ represents a value of the output sample at a particularly denoted sample segment and sampling cycle n, and $E\{\}$ indicates an averaging operation over a plurality of sampling cycles; and, a plurality of timing control units respectively coupled to said ADC channels, said timing control units adjusting time delays for the sampling clock within respective sample segments responsive to corresponding ones of the timing skew factors generated by said timing skew detection unit;

whereby the series of sample segments is aligned substantially with the sampling clock.

20. The system as recited in claim 19, wherein said timing skew estimator portion includes a plurality of second digital adder, second digital multiplier, and summing block cells for combining the error signals received from said error signal generation portion to generate a set of timing skew factors $\Delta\tau_k$ for the frame of sample segments, the set of timing skew factors $\Delta\tau_k$ being defined according to:

$$\Delta\tau_2 = X_1 - \Delta\tau_N$$

$$\Delta\tau_k = X_{k-1} + 2\Delta\tau_{k-1} - \Delta\tau_{k-2}, k = 3, \ldots, \frac{N}{2} - 1$$

$$\Delta\tau_k = X_{k+1} + 2\Delta\tau_{k+1} - \Delta\tau_{k+2}, k = \frac{N}{2}, \ldots, N - 1$$

where:

$$\Delta\tau_N = \frac{1}{N}\sum_{k=1}^{N}\left(\frac{N+2}{2} - k\right)X_k$$

if N is even; and,
where:

$$\Delta\tau_N = \frac{1}{N}\sum_{k=1}^{N}\left(\frac{N+1}{2} - k\right)X_k$$

if N is odd.

\* \* \* \* \*